TOOL FOR MAKING CORDWOOD MODULE

Original Filed Nov. 29, 1963

INVENTORS
R. E. KLEIN
J. E. DRIVER
BY
ATTORNEY

TOOL FOR MAKING CORDWOOD MODULE

Original Filed Nov. 29, 1963

United States Patent Office 3,514,988
Patented June 2, 1970

3,514,988
TOOL FOR MAKING CORDWOOD MODULE

Robert E. Klein and James E. Driver, Sr., Fort Wayne, Ind., assignors to International Telephone and Telegraph Corporation, a corporation of Delaware Original application Nov. 29, 1963, Ser. No. 327,130. Divided and this application May 29, 1967, Ser. No. 652,644
Int. Cl. B21d *31/02, 53/00*
U.S. Cl. 72—332 3 Claims

ABSTRACT OF THE DISCLOSURE

A tool for use in fabricating multi-layered printed circuit boards comprising a punch and die set for providing passage apertures in the boards having tabs contiguous to said apertures. The die has apertures therein which in cooperation with punches cause the current carrying layers of the boards to shear in part and bend in part. The bent part forms a shim which causes the base portion of the board to shear around the entire circumference of the aperture in the die to thereby form the passage apertures having the tabs thereat.

This invention relates to electronic component modules and more particularly to methods of and tools for making printed circuit boards especially—although not exclusively—for use in cordwood modules.

This is a division of patent application Ser. No. 327,130 filed on Nov. 29, 1963 and assigned to the assignee of this application. The parent application issued on Apr. 4, 1968 as U.S. Pat. No. 3,375,576.

Heretofore, electronic circuitry has progressed from hand wired chassis through printed wiring to module construction. With these structural changes, engineering techniques have also changed from individual component-to-component design through logic design to automated design. Design automation programs utilize computers for selecting circuit stages and components according to performance requirements. These stages and components are generally pre-formed as modules which may be plugged together in a great variety of options.

This design automation process has generated a need for a wide variety of standard circuit modules. To be of greatest value, these modules should be of the miniature or sub-miniature, plug-in type, extremely reliable in operation and economical to build. In meeting the miniaturization requirement, printed circuit boards have been utilized to provide wiring between and a sturdy support for the module components. However, problems are sometimes encountered when soldering the components to the printed wiring. For example, in sub-miniaturized modules, the spaces between etched conductors become very small, and this requires critical quality control. This problem of conductor spacing has been solved by providing tab terminals integral with the printed wiring and when welding the components to the terminals. However, this solution has not been entirely adequate since the tabs have been relatively expensive to form. Another problem encountered in fabricating sub-miniaturized modules is minimizing the space required to provide connections between the module units and the plug-in terminals mounted on the module housing. This problem has also been solved by the expedient of soldering or welding terminals directly to proper portions of the module printed circuit board. This, in turn, introduces greater fabrication expenses.

The above solutions to the packaging problems have resulted in reliable and compact modules. But these modules have the disadvantage that the many manufacturing steps necessary to provide the printed wiring board with suitable welding tabs and plug-in terminals become quite costly and make potential sources of circuit failure.

Therefore, an object of this invention is to provide new and improved methods of and tools for making printed wiring modules. Another object is to provide printed circuit boards having tab terminals suitable for welding together electronic components and plug-in terminals. Yet another object is to provide printed circuit boards which can be economically fabricated without loss of either compactness or reliability. A related object of this invention is to provide more economical and reliable methods of manufacturing module units and components therefor.

According to one aspect of the present invention, printed circuit boards are formed by first etching an unpunched base board of insulating material covered with a conductive material. This etching forms the printed wiring. Then the etched board is placed in a tool and die set which simultaneously punches apertures in the board and bends up tab terminals of the conductive material. At the same time, other tabs of the conductive material may also be bent to form external plug-in terminals. Finally, components are welded to desired ones of the tab terminals.

In accordance with another aspect of the invention, the tool and die set may be viewed as a two-step, self-forming tool for making a tab and aperture in a lamina of at least two dissimilar materials. For example, when the tool and die are used to manufacture a printed circuit board, the lamina is made-up of the insulating baseboard and the metal foil; however, the tool and die are not limited to use with this particular material. The important feature is that a first of the lamina materials has physical characteristics which make it more ductile than the other of the lamina materials. The other material has a shear strength which is much greater than the sear strength of the first material. Thus, the first material extrudes when subjected to a given force, which is adequate to shear the other material. The die has an aperture with a continuous wall. Part of the wall terminates at a cutting edge and the remainder of the wall terminates at a bending edge. A punch has an edge adjacent the cutting edge of the aperture shaped so that the punch and the aperture form a pair of cooperating shearing edges. The edge of the punch adjacent the bending edge is shaped to bend a tab of the shear material which is then pushed down to form a shim liner inside the aperture. This shim covers the bending edge and acts with the adjacent edge of the punch to form a pair of cooperating shearing edges. The punch and die now form a tool for punching a hole through the ductile material.

The above mentioned and other features of this invention and the manner of obtaining them will become more apparent, and the invention itself will be best understood by reference to the following description of an embodiment of the invention taken in conjunction with the accompanying drawings, in which.

In its broadest form, the invention relates to methods of and tools for fabrication when it is necessary to work on a lamina of dissimilar materials. Those skilled in the art will readily perceive how these methods and tools may be used to build many different structures. However, to provide a concrete example of one such structure, this specification now turns to a description of how to build a module of electronic components.

Figure 1:
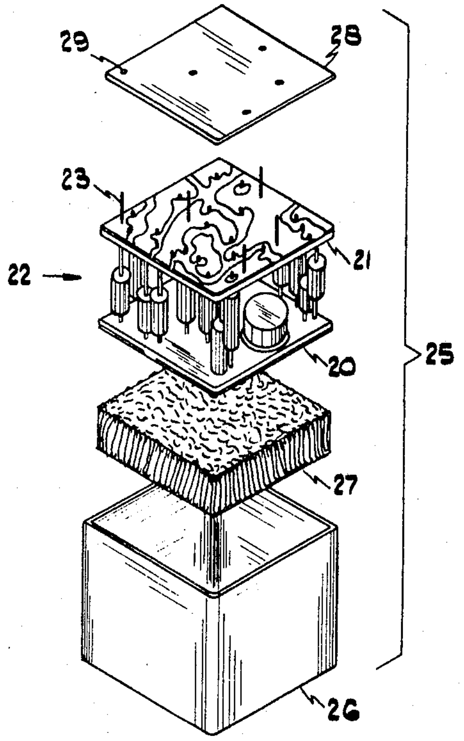
FIG. 1 is an exploded view which shows how a module may be made according to the invention.

The manner of assembling this module should be apparent from an inspection of FIG. 1 where two printed circuit boards 20, 21 are positioned in spaced parallel relation. Any suitable number of electronic components 22 are supported between these boards since the leads on the components pass through hole in the boards. These leads are then soldered or welded into position on the boards. Conventionally, this type of arrangement is called a "welded cordwood module."

External tabs, prongs, or lugs may be provided on the module for making plug-jack connections with other circuits, as shown at 23. Or other suitable means may be provided for making external connections, such as a cable of wires, for example.

After the welded cordwood module is completed, an assembly 25 is put together to make a completely enclosed—preferably hermetically sealed—housing. This assembly 25 comprises a can or cover 26 which may be either extruder or drawn to form a desired cup shape of thin sheet metal. Next a shock absorbing material (such a pad of plastic foam or other suitable material) 27 is placed in the bottom of the can 26. Then, the cordwood module 20–23 is placed in the can on top of the pad 27. Thereafter, a potting compound may be poured into the can to fill all unused space and to provide the desired hermetic seal. Finally, a header or cover plate 28 is attached to cover the mouth of can 26 and complete the enclosure. This header has one or more holes (such as 29) through which the terminals (such as 23) may pass. Alternatively, the cover may have a single opening through which any desired number of leads may pass.

Figures 2, 3:
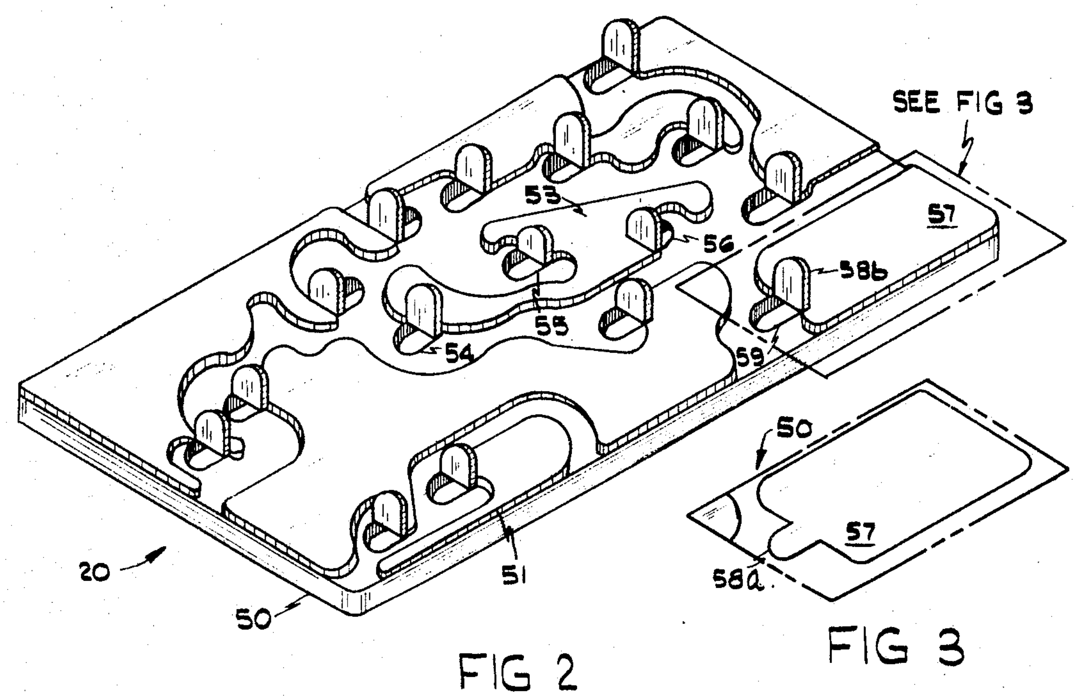
FIG. 2 is a perspective view of a printed circuit board formed according to the teaching of this invention.
FIG. 3 is a view of a portion of the FIG. 2 board before a terminal tab is formed therein.

The details about the construction of the printed circuit boards may become more apparent from a study of FIG. 2. Here we show the board 20 as it appears after it is manufactured according to the teachings of the invention and before any components are mounted on it. As is conventional, this board 20 comprises a baseboard of insulating material 50 for supporting a metal foil 51. Initially, this foil is a solid sheet of electrically conductive material. Then certain unwanted parts of the foil are etched away by any known process to leave pieces of the foil in desired geometrical shapes. Each piece comprises a conductor extending between desired contact points. For example, the piece of foil 53 extends between the three contact points 54–56. In like manner, other pieces of foil extend between other contact points.

Preferably, tab shaped sections are pre-formed on the foil during the etching process. These pre-formed shapes are the beginnings of tab terminals which are yet to be formed. Thus, as shown in FIG. 3, the piece of foil 57 is provided with a tab shaped section **58*a* which is still bonded to the board 50, just as all of the other pieces of foil 51 are also still bonded to the board. Later, during the manufacturing process, this pre-formed tab section is separated from the insulating base material 50 and then bent upward to form the tab terminal 58*b* (FIG. 2). Simultaneously with the bending of this tab, an aperture 59 is formed in the insulating material of board 50**. In like manner an aperture and tab terminal are formed simultaneously at every contact point.

Figure 4:
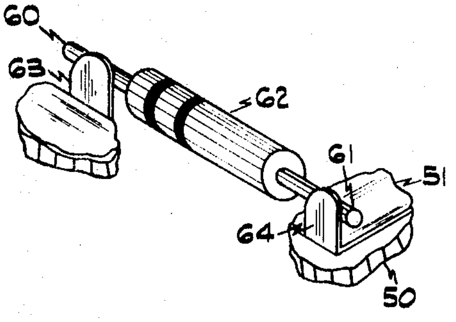
FIG. 4 shows one manner in which electronic components may be welded to the tab terminals of the FIG. 2 printed circuit board.
Figure 5:
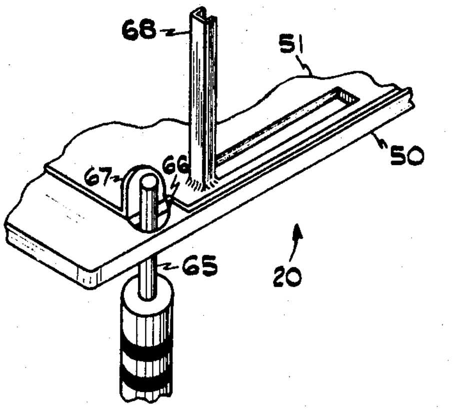
FIG. 5 shows an alternative way of welding components to the tab terminals and also a way of forming a plug for making terminal base connectors.

The electronic components may be joined to these tab terminals by any suitable process including soldering, or wire wrapping; however, the preferred embodiment of the invention utilizes welding techniques of a type pioneered in the processes developed to manufacture sub-miniature vaccum tubes. In one embodiment, the components are mounted on a single side of a single printed board. For example, as shown in FIG. 4, the leads 60, 61 of component 62 are welded to tab terminals 63, 64. In another embodiment, each of the components is mounted perpendicularly to the board 20. To do this, one of the component leads is passed through an aperture in the board; then it is welded to a tab terminal adjacent the aperture. For example, FIG. 5 shows the lead 65 as passing through the aperture 66 where it is welded to the tab terminal 67. A combination of these techniques are used to manufacture the cordwood module of FIG. 1 where some components are mounted on a single side of the board 20, and other components are suspended between the boards 20, 21.

To provide a terminal base connector for connecting the module to external electrical circuits, many different procedures may be followed. According to one procedure, entirely conventional printed circuit board connectors are used. According to another procedure, some of the component leads, such as 65, are not cut off flush with the tab terminal, but are allowed to extend outwardly from the printed circuit board for a distance adequate to provide either solder or plug-in terminals. According to yet another procedure, an extra long tab terminal 68 is bent up from the conductive metal foil 51. To provide added strength, these long tab terminals are given some added degree of cross section thickness. For example, the long tab 68 is shown as bent to form a somewhat rectangular cross section. It could also be given a somewhat semicircular or other suitable cross section. These long tabs provide terminals for making solder, wire-wrap, or plug-in connections. If plug-in types of terminals are provided, they should be geometrically arranged so that they will fit into a desired socket base, such as a sub-miniature tube socket.

Figure 6:
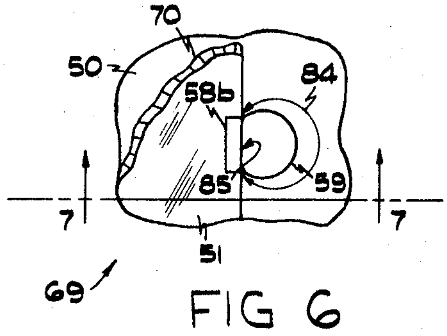
FIG. 6 is a top plan view showing a fragment of a printed circuit board having a tab terminal of the conductive material formed thereon.
Figure 7:
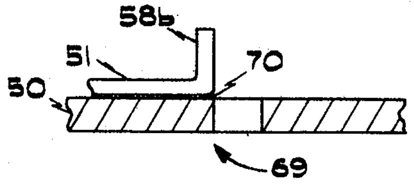
FIG. 7 is a side elevation cross-section view taken along line 7—7 of FIG. 6.

A section of printed circuit board having an exemplary tab terminal is shown in FIGS. 6, 7. As should be apparent by an inspection of these figures, the tab **58*b* is formed on a sandwich 69 of materials which we call a lamina of dissimilar materials. A first of these materials 50 is the insulating board which supports the second material which is the metal foil 51. The third material 70, which best appears in FIG. 7, symbolically represents the attraction forces which bond the materials 50 and 51 together. These bonding forces may be thought of as an adhesive such as cement, heat seals, or as any other bonding. In one exemplary construction, the layer 70** was an epoxy with a pull strength of 5 to 10 pounds per square inch.

The first material 50, which we call the "pliable material," has physical characteristics which make it more pliable than the second material 51. In the exemplary construction, the pliable material was "Mylar," per mil. Spec. 1–631, having a thickness of .016±.002 inch. The shear strength of the second material 51, which we call the "shear material," is greater than the shear strength of the pliable material. In the exemplary construction, the shear material was .007 inch thick and met a Federal specification for grade "A," 99% nickel.

It should be recognized that the layer 70 could theoretically represent a continuum of bonding forces extending from zero to infinity. At one extreme, the shear material 51 could simply lay upon the pliable material 50 with no attractive force between them. At the other extreme, the shear material could be alloyed with the ductile material so that the attractive forces approached infinity. In the practice of this invention, the useful range of these forces lies in the area where the bond between the materials 50, 51 break when the lamina is subjected to a shearing force great enough to shear the shear material but not yet great enough to shear the pliable material.

Figure 8:
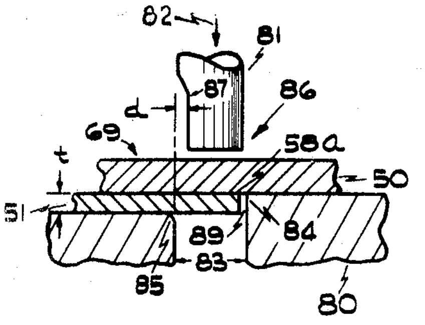
FIGS. 8–10 show a sequence of steps followed during a practice of the invention.
Figure 9:
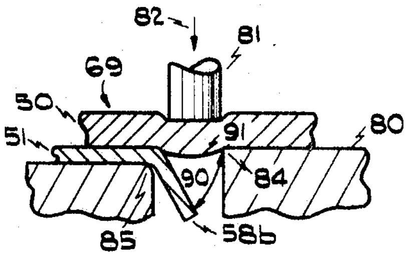
Figure 10:
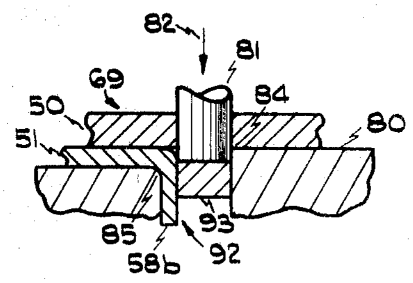

With this background of structural information in mind, the reader will better understand how to practice the invention when he studies the sequence of events depicted in FIGS. 8–10. Here the tool for fabricating the tab terminal is shown as a die 80 and a punch 81. The shearing force is symbolically represented by an arrow 82.

The die 80 comprises a block (which may be steel) with an aperture 83 having a continuous inner wall which closes upon itself. As shown in FIG. 6, this wall is preferably shaped to provide a hole which is somewhat "D-shaped." A portion of this wall terminates at a cutting edge, as shown at 84. The remainder 85 of this wall terminates at a bending edge. The bending edge preferably has a radius of curvature which is equal to or greater than the thickness $t$ of the metal foil 51.

The punch 81 is positioned above and in cutting relationship with the aperture 83. The contour of the punch is complementary to the contour of the aperture. Thus, the round side 86 of a generally "D-shape" cross section of the punch has a cutting edge and the flat side 87 of the "D-shape" cooperates with the bending edge 85. The distance $d$ between punch edge 87 and the bending aperture edge 85 is approximately equal to the foil thickness $t$. Upon reflection, it should be clear that the punch and aperture edges 84, 86 cooperate to form a pair of shearing edges. The edges 85, 87 cooperated to form a pair of bending edges.

To practice the invention, the lamina 69 is placed between the punch 81 and the die 80 (FIG. 8). Preferably, there is a related jig (not shown) which properly positions the lamina with respect to the die. When so positioned the unbent tab section 58*a* extends partially across the width of the aperture 83, leaving a small space 89 where the foil does not appear within the aperture 83. It should be noted that the foil now extends from a point beyond the aperture, over the bending edge 85, and toward, but not to the shearing edge 84.

The first step in the punching process occurs when the punch 81 is closed toward the die by being lowered onto the lamina with a force which begins to deform the pliable material 50. This material does not immediately tear, but begins to extrude into the aperture 83. As the punch begins to penetrate the ductile material, it begins to stretch. This stretching of the material 50 exerts a pulling force upon the bond 70 between the ductile material 50 and the shear material 51. An important aspect of the invention is that the shear material should at least begin to break away from the ductile material (as shown at 90) before the ductile material begins to tear.

As the ductile material continues to extrude into the aperture 83, it forms a dish shape, as shown at 91. The tab terminal 58*b*, which has snapped loose from the ductile material, begins to bend without tearing because of the radius of curvature 85 and because the dish shape 91 of the ductile material applies a uniform non-shearing pressure over the entire area of the shear material which is wrapping around the bending edge 85. Also, the elasticity of the ductile material acts somewhat as a shock absorber to reduce any shearing forces which might otherwise tend to tear the shear material.

The second step in the punching process occurs when the ductile material 50 begins to form a plunger. The plunger presses the tab 58*b* against the inner surface of the aperture 83. As the tab bends, it forms itself into a shim lining the aperture and filling the space $d$ between the side 87 of the punch and the bending edge 85 of the aperture. The shim now covers the bending edge and occupies the space into which the ductile material is trying to flow. This causes the ductile material to tear and form a plug 93. As the punch forces the plug 93 through the aperture 83 the tab 58 is smoothed against the wall of the aperture. This forms the upstanding tab terminal, thus completing the two-step punching process.

Figure 11:
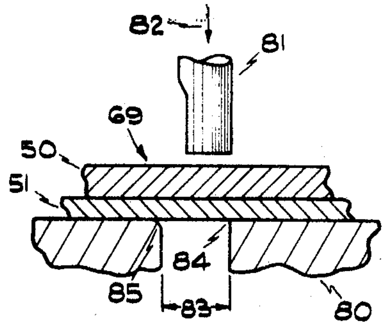
FIGS. 11 and 12 show an alternative sequence of events.
Figure 12:
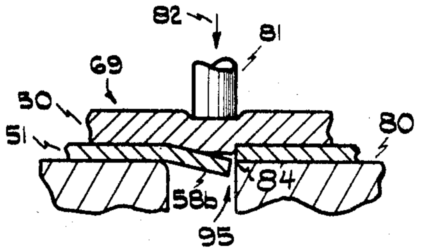

In another embodiment of the invention, FIGS. 11, 12, the tabs are not pre-formed during the etching process, as taught by FIG. 3. Instead, the foil 51 initially extends entirely across the mouth of aperture 83, as shown in FIG. 11. In FIG. 12, the punch 81 is closed toward the die which shears the tab by causing it to tear against the edge 84. Before the tab is sheared out of the foil, the dish 91 cannot appear because the unbroken foil covers the entire mouth of the aperture 83. After the shear material 51 is cut as shown in FIG. 12, the dish 91 does appear and the tab is formed in the manner shown by FIGS. 8–10.

Figure 13:
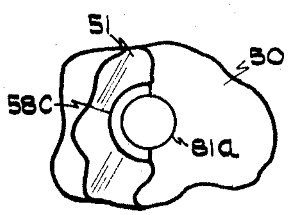
FIGS. 13 and 14 show various punch shape modifications for making alternative shapes for the cross-sections of the tabs.
Figure 14:
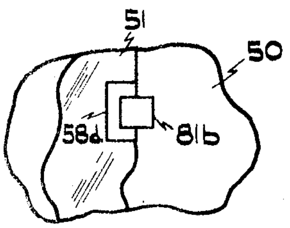

In yet another embodiment of the invention, the punch and aperture are not "D-shaped" and the finished tab terminal is not flat in cross section. Instead, as shown at 81*a* (FIG. 13), the punch and die may form a somewhat semi-circular cross section in the tab terminal 58*c*. Or, as shown at 81*b* (FIG. 14), the punch and die may form a somewhat rectangular cross section in the tab terminal 58*d*. Of course, other cross section shapes may also be provided. In both FIGS. 13 and 14, the die shape is the shape of the punch 81 plus the tab 58. The object of the FIGS. 13, 14 punchings is to add mechanical strength by increasing the rigidity of the tab terminal. This is how the long tab terminal 68 (FIG. 5) is formed.

In the exemplary construction, the International Telephone and Telegraph Corporation had very good results with the described "Mylar" and nickel lamina bonded together by an epoxy. The die 80 was simply a block of steel with holes drilled at selected locations to form a number of apertures, such as 83. One edge of each hole was then rounded, as by filing, to provide the bending edge 85. The punches 81 were made from readily available steel rod stock having approximately the same diameter as the holes. The stock rod was first cut into a number of short lengths. Then one side of each short length was ground away to provide the distance $d$ between the punch and the bending edge 85. Thereafter, each of the short lengths were secured in a header with the ground side of each rod positioned adjacent the rounded, bending edge of the associated die aperture.

For the precision required in printed circuit work, it was found that there were no extremely close tolerance requirements for the punch and die. The relationships which were judged to be the most important for design considerations were the differences between the ductility and shear strength of the two materials in the lamina, and the force used to drive the punch through the lamina. The simplest statement about these relationships is that the ductility of the plastic should be such that it forms the dish 91 under a pressure adequate to shear the foil.

While the principles of the invention have been described above in connection with specific apparatus and applications, it is to be understood that this description is made only by way of example and not as a limitation on the scope of the invention.

We claim:

1. A two-step tool and die for forming an aperture in a lamina of at least two dissimilar materials,
   the physical characteristics of one of said materials making it extrude when subjected to a given shearing force,
   the physical characteristics of the other of said materials making it shear when subjected to the same given shearing force,
   said die having an aperture with a continuous wall,
   part of said wall terminating in a sharply defined right angle to provide a cutting edge and the remainder of said wall terminating in an arcuate edge having a radius of curvature to provide a bending edge, and punch means positioned in cutting relation with said aperture, said punch means having a leading end that is entirely parallel to the top surface of said die, the walls of said punch means being normal to said leading end and spaced equidistantly from one another over the entire operating length of said punch means, the edge of the leading end of said punch means adjacent said cutting edge being shaped and positioned for contiguous relationship with the die apertures so that the punch means and the die form a pair of cooperating shearing edges, the edge of the leading end of said punch means adjacent said bending edge being shaped and positioned to be spaced apart from said bending edge, whereby said one material is bent until it is substantially contiguous to the said wall terminating in the bending edge to cooperate with said punch in forming a pair of cooperating shearing edges for cutting a hole in said other material.

2. The tool of claim 1 wherein said punch is cylindrically shaped and said aperture comprises a first cylindrical section longitudinally truncated and joined to a second longitudinally truncated cylindrical section, said first section terminating in the cutting edge and having a larger diameter than said second section, said second section having a diameter such that said punch is in registry with the walls of said second section, whereby said one material is bent into a tab terminal having a somewhat semicircular cross section.

3. The tool of claim 1 wherein said punch has a parallelepiped share and said aperture comprises a first parallelepiped section longitudinally truncated and joined to a second longitudinally truncated parallelepiped section, said first section terminating in the cutting edge and having a larger cross sectional width than said second section, said second section having dimensions wherein said punch nests within said second section, whereby said one material is bent.

References Cited

UNITED STATES PATENTS

| | | | |
|---|---|---|---|
| 430,000 | 6/1890 | Clark et al. | 29—148 |
| 1,980,154 | 11/1934 | Coe | 29—513 |
| 2,590,807 | 3/1952 | Voslamber | 113—116 |
| 2,610,390 | 9/1952 | Locke | 113—119 |
| 2,694,249 | 11/1954 | Kapp | 29—626 |
| 3,372,474 | 3/1968 | Polley et al. | 113—119 |
| 1,381,102 | 6/1921 | Bell | 72—325 |
| 1,468,271 | 9/1923 | Bechtel | 72—325 |
| 1,675,910 | 7/1928 | Riker | 72—325 |
| 2,264,627 | 12/1941 | Eisenhauer | 72—325 |
| 3,094,158 | 6/1963 | Reid | 72—325 |

CHARLES W. LANHAM, Primary Examiner

E. M. COMBS, Assistant Examiner

U.S. Cl. X.R.

29—513; 72—325; 113—119